United States Patent
Hsu et al.

(10) Patent No.: US 9,217,536 B1
(45) Date of Patent: Dec. 22, 2015

(54) FIXING DEVICE FOR SLIDING MECHANISM

(71) Applicant: JOCHU TECHNOLOGY CO., LTD., Hsinchu (TW)

(72) Inventors: Kuo-Ming Hsu, Tainan (TW); Tzu-Chien Huang, Taipei (TW); Hsin-Han Lee, Hsinchu (TW); You-Lun Wu, Taoyuan (TW)

(73) Assignee: JOCHU TECHNOLGY CO., LTD., Hsinchu County (TW)

( * ) Notice: Subject to any disclaimer, the term of this patent is extended or adjusted under 35 U.S.C. 154(b) by 78 days.

(21) Appl. No.: 14/296,920

(22) Filed: Jun. 5, 2014

(51) Int. Cl.
F16M 13/00 (2006.01)
F16M 13/02 (2006.01)
A47B 88/04 (2006.01)
A47B 88/00 (2006.01)

(52) U.S. Cl.
CPC .......... *F16M 13/022* (2013.01); *A47B 88/0085* (2013.01); *A47B 88/04* (2013.01)

(58) Field of Classification Search
CPC ... F16M 13/022; A47B 88/0085; A47B 88/04
See application file for complete search history.

(56) References Cited

U.S. PATENT DOCUMENTS

| | | | | |
|---|---|---|---|---|
| 1,343,513 A * | 6/1920 | Lenhart | .................. | A47B 88/10 312/334.12 |
| 2,565,784 A * | 8/1951 | Sheean | .................. | A47B 88/10 312/286 |
| 2,914,370 A * | 11/1959 | Hensch | .................. | A47B 88/10 312/286 |
| 3,485,539 A * | 12/1969 | Vaughn | .................. | A47B 88/10 384/19 |
| 4,183,596 A * | 1/1980 | Greene | .................. | A47B 88/10 312/286 |
| 4,872,734 A * | 10/1989 | Rechberg | ................ | A47B 88/10 312/333 |
| 5,085,523 A * | 2/1992 | Hobbs | .................... | A47B 88/16 384/18 |
| 5,624,171 A * | 4/1997 | Soja | .................... | A47B 88/0422 312/334.44 |
| 5,851,059 A * | 12/1998 | Cirocco | ................. | A47B 88/10 312/330.1 |
| 5,871,265 A * | 2/1999 | Stewart | .................. | A47B 88/10 312/333 |
| 8,147,011 B2 * | 4/2012 | Chen | ........................ | F16C 29/04 312/333 |
| 8,511,765 B1 * | 8/2013 | Chen | ....................... | A47B 67/04 312/286 |
| 2005/0017614 A1 * | 1/2005 | Cirocco | ................. | A47B 88/08 312/333 |
| 2005/0274680 A1 * | 12/2005 | Allen | .................... | A47B 88/044 211/26 |
| 2011/0280506 A1 | 11/2011 | Chen et al. | | |
| 2012/0201484 A1 | 8/2012 | Chen et al. | | |
| 2012/0308297 A1 | 12/2012 | Chen et al. | | |
| 2013/0004101 A1 | 1/2013 | Chen et al. | | |
| 2013/0058596 A1 | 3/2013 | Chen et al. | | |

* cited by examiner

*Primary Examiner* — Mark Wendell
(74) *Attorney, Agent, or Firm* — Rabin & Berdo, P.C.

(57) ABSTRACT

A positioning device for a sliding mechanism that includes exterior, intermediate and interior plates, each plate defining inner and outer side surfaces, the positioning device is characterized by: the intermediate plate having a stop block formed on the inner side surface; and the interior plate including an elongated release rod that is mounted movably on the outer side surface and that has a limit notch receiving the block, and a resilient element engaging the propeller portion for restricting a longitudinal movement of the rod, the interior plate having a position limiting unit constituted by two limiting stubs mounted movably on the outer side surface and having pointed free ends and a biasing element for biasing the limiting stubs in such a manner that the pointed free ends extend into the notch to contact opposite ends of the block, thereby preventing relative movement between the interior and intermediate plates.

7 Claims, 8 Drawing Sheets

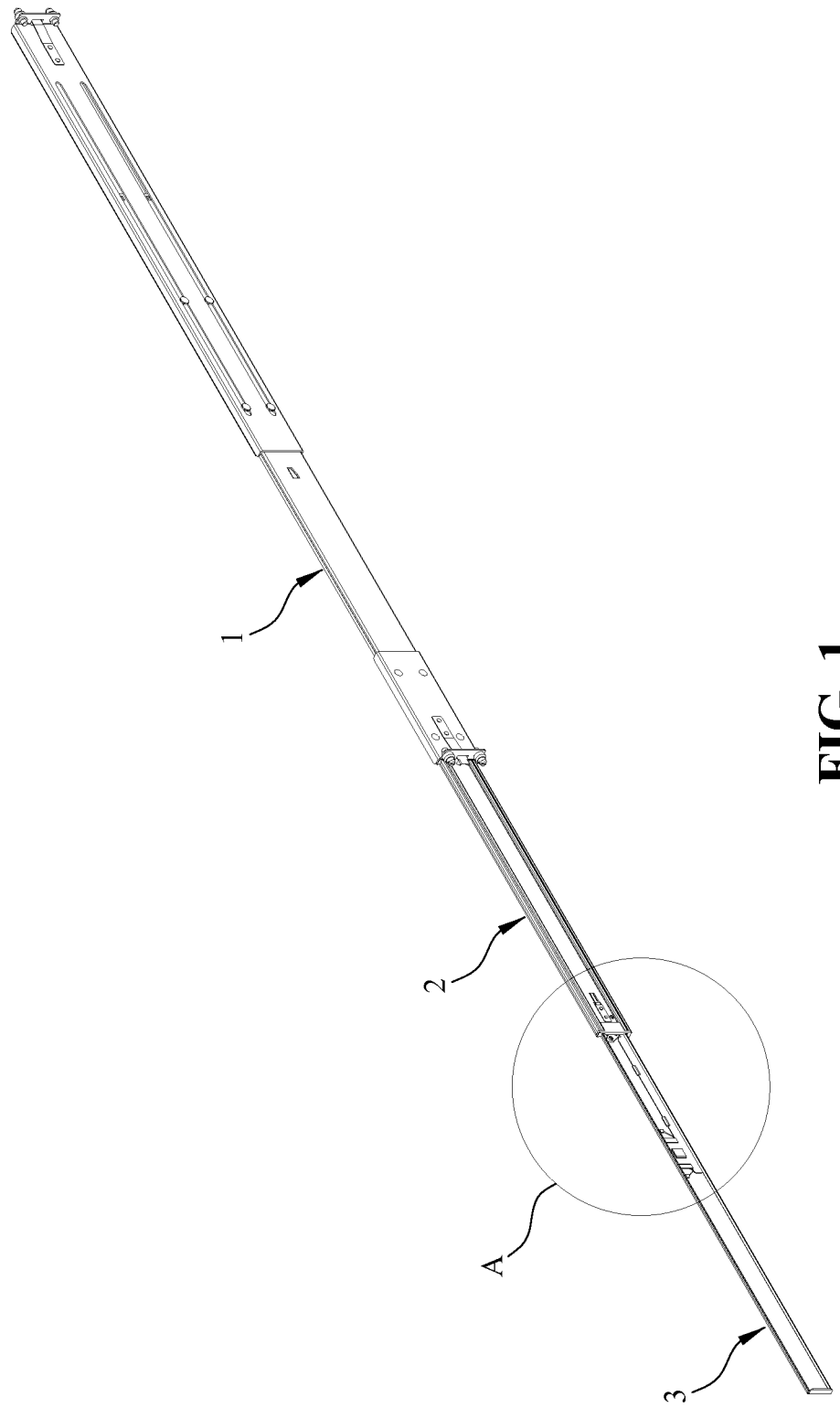

FIXING DEVICE FOR SLIDING MECHANISM

BACKGROUND OF THE INVENTION

1. Field of the Invention

The present invention relates generally to a fixing device, and more particularly to a fixing device for a sliding mechanism consisting of slidably connected exterior, intermediate and interior plates, wherein once the interior plate is pulled outward from the intermediate plate, the interior plate is retained stably outside of the intermediate plate or the interior plate is easily removed from the intermediate plate if desired, thereby facilitating the user.

2. The Prior Arts

In a personal computer (PC), a server is mounted slidably to a computer casing via two slide plates, which cooperatively define a slide channel therebetween. In case of repairing, the server can be pulled outward from the casing and after the repairing the server is pushed slidably back into the casing. A conventional sliding mechanism used in a PC generally includes an exterior plate, an interior plate and sometimes an intermediate plate between the exterior and interior plates in order to increase a total traveling length of the sliding mechanism. The exterior plates are fixed securely to two opposite sides of the computer casing while the interior plates are used for carrying the server thereon.

For a conventional sliding mechanism consisting of an exterior plate, an intermediate plate and an interior plate connected slidably relative to one another, a fixing device is provided between the intermediate plate and the exterior plate in order to provide stability to the server, which is disposed outwardly of the computer casing after successively pulling the interior plate from the intermediate plate, the intermediate plate from the exterior plate, such that the intermediate plate is exposed and thus retained at the stable condition with respect to the exterior plate. The conventional fixing device generally includes two connection rods or a spring plate and hook-and-looped fasteners and etc such that great manufacturing cost is resulted owing to too many pieces. It is noted that in case of a great impact applied on the conventional sliding mechanism at this time, ruin of the sliding mechanism will be resulted since the plates cannot withstand the great impact.

Taiwanese Patent Publication No. M350226 discloses a sliding mechanism consisting of an exterior plate, an intermediate plate slidably mounted to the exterior plate, an interior plate slidably mounted to the intermediate plate, and a locking structure. The locking structure includes a stepped channel formed through the exterior plate and a slide block formed on the intermediate plate for slidably engaging the stepped channel and an elongated pull rod mounted on the interior plate. The elongated pull rod is formed with an inclined side when the elongated pull rod is pulled in a first direction away from the exterior plate, the inclined side pushes the slide block to move in a second direction perpendicular to the first direct, thereby disengaging the intermediate plate from the exterior plate.

One drawback of the above sliding mechanisms resides in that once the interior plate is pulled outward from the intermediate plate and in case of an external impact, the hook-and-looped fasteners or the locking structure are subjected to damage easily, which, in turn, leads to ruin of the sliding mechanism.

SUMMARY OF THE INVENTION

A primary objective of the present invention is to provide a slide positioning device for a sliding mechanism that includes an exterior plate, an intermediate plate connected slidably to the exterior plate and an interior plate connected slidably to the intermediate plate. When the intermediate plate is pulled outwardly from the intermediate plate, the former two do not easily damaged or ruined owing to specific structure of the slide positioning device of the present invention.

According to the present invention, the intermediate plate has a stop block. The interior plate includes a position limiting unit and an elongated release rod such that once the interior plate is pulled outwardly fully from the intermediate plate, the position limiting unit is capable of stably retaining the stop block, thereby preventing relative movement between the interior and intermediate plates. Under this condition, even if a great external force is applied thereto, no damage is done on the slide positioning device of the present invention. When pushing the interior plate inward of the intermediate plate or removal between the two plates, the release rod can be easily manipulated in such a manner to disengage the position limiting unit relative to the stop block.

A slide positioning device of the present invention is used in a sliding mechanism including an exterior plate, an intermediate plate connected slidably to the exterior plate and an interior plate connected slidably to the intermediate plate, each plate further defining inner and outer side surfaces. The slide positioning device of the present invention is characterized by: the intermediate plate having a stop block formed on the inner side surface thereof; and the interior plate including a position limiting unit, an elongated release rod that is mounted movably on the outer side surface and that has a propeller portion distal from the position limiting unit and a limit notch adjacent to the position limiting unit for receiving the stop block, and a resilient element engaging resiliently the propeller portion for restricting a longitudinal movement of the release rod with respect to the interior plate. The position limiting unit includes first and second limiting stubs that are mounted movably on the outer side surface and that have pointed free ends. The interior plate further includes a biasing element mounted between for biasing the first and second limiting stubs in such a manner that the pointed free ends extend into the limit notch so as be in contact with two opposite ends of the stop block, thereby preventing relative movement between the interior plate and the intermediate plate.

In one embodiment of the present invention, the interior plate is formed with a plurality of first retention holes and a plurality of second retention holes. The first limiting stub is mounted movably in two adjacent first retention holes via rivets while the second limiting stub is mounted movably in two adjacent second retention holes via rivets such that the pointed free ends of the first and second limiting stubs simultaneously contact two opposite ends of the limit notch.

For facilitating movement of the release rod relative to the interior plate, each pointed free end of the first and second limiting stubs is defined by two inclined sides, one of which is in contact with a corresponding end of the notch so as to permit the release rod to slide within the interior plate with ease.

In one embodiment of the present invention, the biasing element is a leaf spring having two ends mounted into adjacent pair of the first and second retention holes and a curved intermediate portion between two ends for biasing against the first and second limiting stubs such that the pointed free ends simultaneously contact the two opposite ends of the limit notch.

In order to define the shortest traveling distance for the release rod relative to the interior plate, each of the first and second retention holes is elongated and extends in a transverse direction relative to a longitudinal length of the interior plate.

In one embodiment of the present invention, the interior plate has two embedded holes formed on the inner side surface. The propeller portion of the release rod has two engagement flaps located between the two embedded holes such that once the resilient element is mounted to the embedded holes, the resilient element engages resiliently the two engagement flaps for restricting the longitudinal movement of the release rod with respect to the interior plate.

Preferably, the resilient element is constituted by two V-shaped clips having vertexes overlapping the two engagement flaps of the release rod respectively to restrict the longitudinal movement of the release rod relative to the interior plate.

In one embodiment of the present invention, the interior plate further has a plurality of aligned rod guides fixed on the outer side surface for guiding an upper edge of the release rod to move stably along the longitudinal length thereof and to prevent untimely disengagement of the release rod from the interior plate.

BRIEF DESCRIPTION OF THE DRAWINGS

The present invention will be apparent to those skilled in the art by reading the following detailed description of a preferred embodiment thereof, with reference to the attached drawings, in which:

FIG. 1 is a perspective view of a slide positioning device of the present invention for use in a sliding mechanism;

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1A:
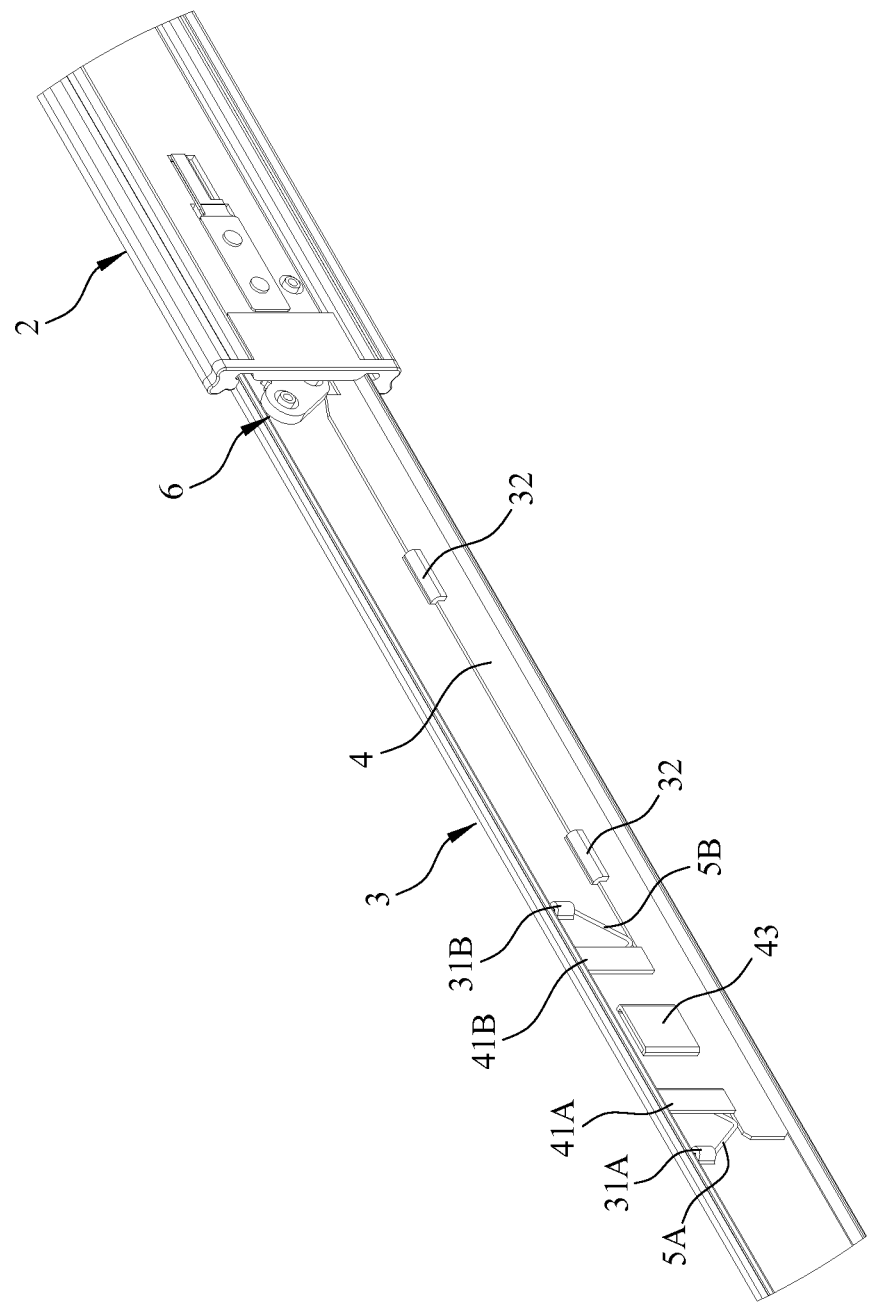
FIG. 1A is an enlarged view of an encircled portion of FIG. 1.

Referring to FIGS. 1 and 1A, wherein FIG. 1 is a perspective view of a slide positioning device of the present invention for use in a sliding mechanism; and FIG. 1A is an enlarged view of an encircled portion of FIG. 1. The slide positioning device of the present invention is used in an electronic device, such as for mounting a server in PC. The sliding mechanism includes an exterior plate 1, which is generally fixed to a side wall of the PC for receiving the server, an intermediate plate 2 connected slidably to the exterior plate 1 and an interior plate 3 connected slidably to the intermediate plate 2 and which generally holds the server thereon such that the server is disposed outwardly of the PC once the interior plate 3 is pulled outward from the intermediate plate 2. Each plate is an elongated plate further has inner side surface defining a slide channel between upper and lower longitudinal peripheries to receive slidably another plate therein and an outer side surface opposite to the inner side surface. The slide positioning device of the present invention is characterized in the following manner.

Figure 2:
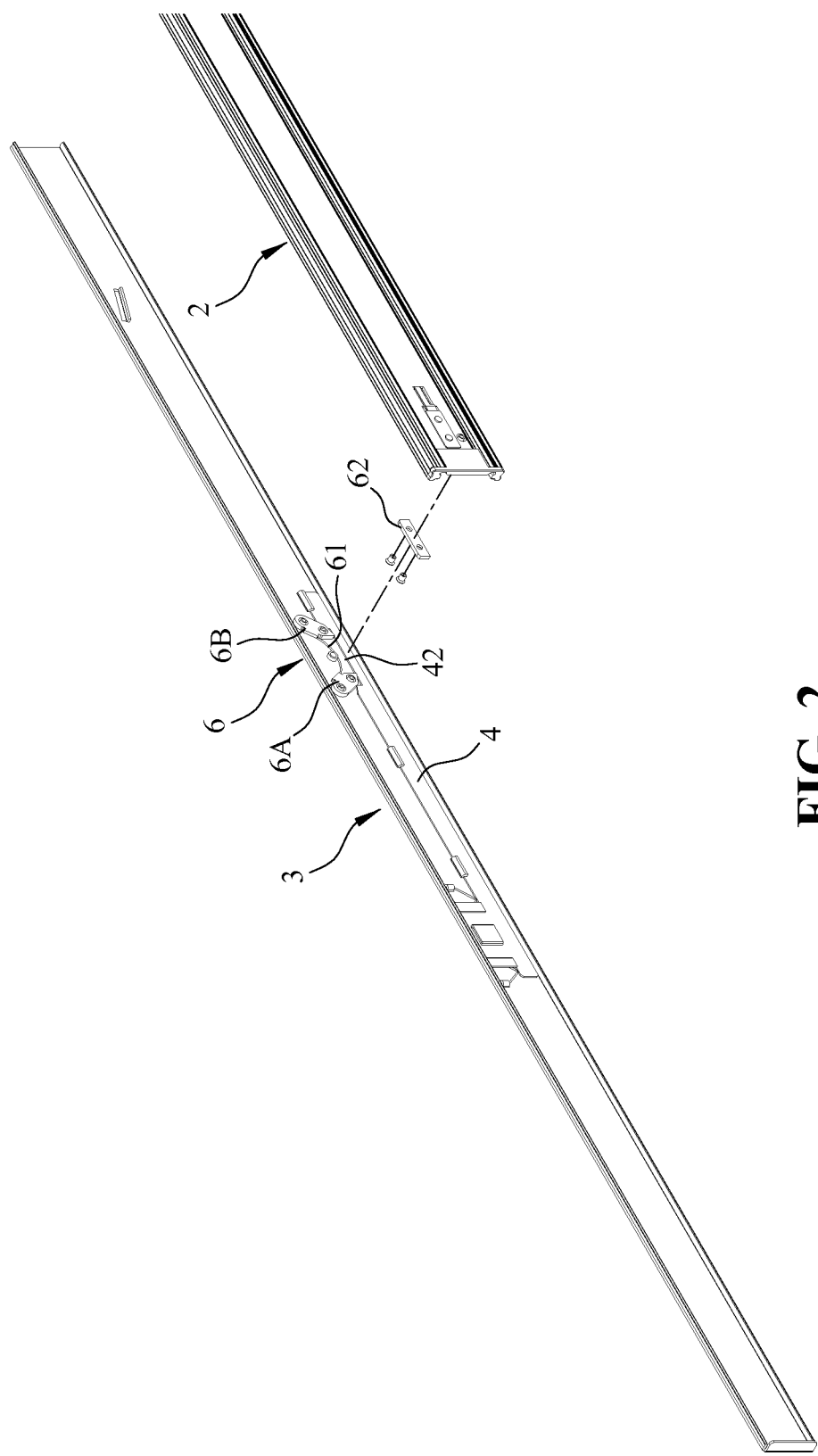
FIG. 2 illustrates the slide positioning device of the present invention for use in the sliding mechanism, which is shown in exploded view.
Figure 3:
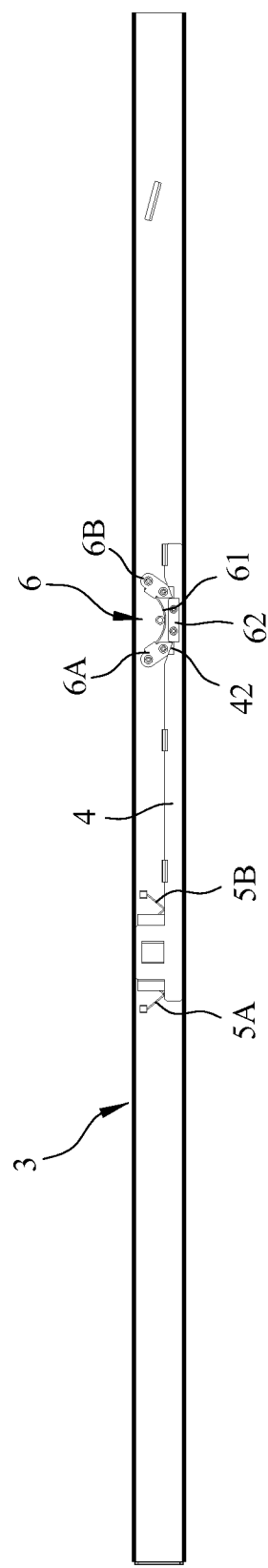
FIG. 3 illustrates the slide positioning device of the present invention for use in the sliding mechanism, which is shown in assembled view.

The intermediate plate 2 has a stop block 62 formed securely via rivets on the inner side surface adjacent to its distal end thereof. The stop block 62 is generally rectangle but the configuration should not be limited only thereto (see FIG. 2).

Figure 4:
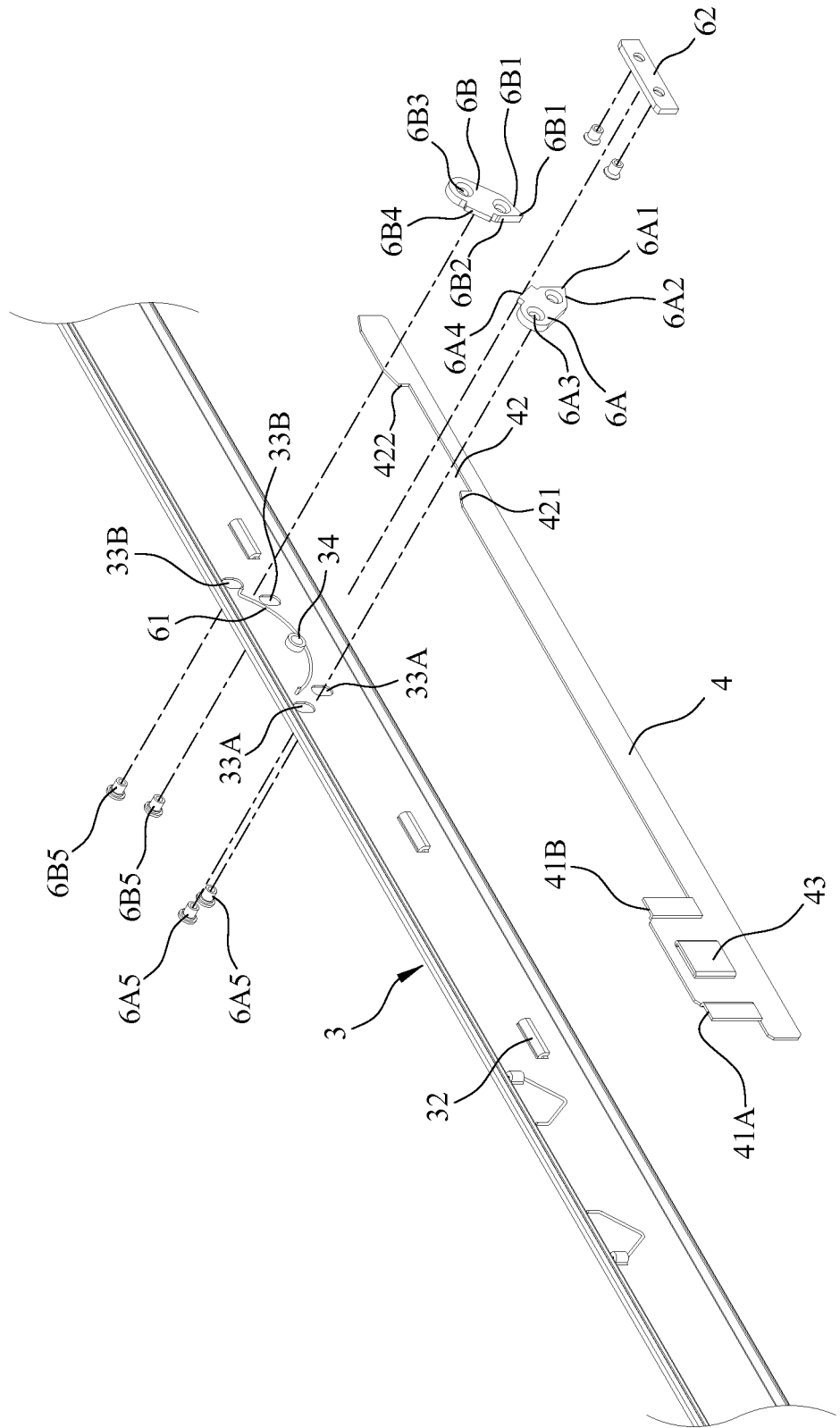
FIG. 4 illustrates the slide positioning device of the present invention for use in the sliding mechanism, where an interior plate is shown in exploded view.

The interior plate 3 includes a position limiting unit 6, a slim elongated release rod 4 (see FIG. 4) that is mounted movably on the outer side surface and that has a propeller portion 43 distal from the position limiting unit 6 and a limit notch 42 adjacent to the position limiting unit 6 for receiving the stop block 62 once the interior plate 3 is slidably inserted in the slide channel of the intermediate plate 2. Preferably, the propeller portion 43 of the release rod 4 is punched in such a manner to form two engagement flaps 41A, 41B while two opposite ends 421, 422 of the limit notch 42 serve as guide sides. A detailed operation of the release rod 4 will be given in the following paragraphs.

The interior plate 3 has a plurality of aligned rod guides 32 which are fixed on the outer side surface and which are formed with guide grooves for guiding the upper edge of the release rod 4 between the propeller portion 43 and the notch 42 so as to permit stable movement of the release rod 4 along the longitudinal length thereof and so as to prevent untimely disengagement of the release rode 4 from the interior plate 3. The interior plate 3 further has two embedded holes 31A, 31B formed on the inner side surface. The engagement flaps 41A, 41B of the release rod 4 are located between the two embedded holes 31A, 31B such that once a resilient element is mounted to the embedded holes 31A, 31B, the resilient element engages resiliently the two engagement flaps 41A, 41B for restricting the longitudinal movement of the release rod 4 with respect to the interior plate 3. In this embodiment, the resilient element is preferably constituted by two V-shaped clips 5A, 5B embedded into the embedded holes 31A, 31B in such a manner that the vertexes of the V-shaped clips 5A, 5B overlap the two engagement flaps 41A, 41B of the release rod 4 respectively to restrict the longitudinal movement of the release rod relative to the interior rod 3.

A position limiting unit 6 includes first and second limiting stubs 6A, 6B. The interior plate 3 is further formed with a plurality of first retention holes 33A and a plurality of second retention holes 33B so that the first limiting stub 6A is mounted movably in two adjacent first retention holes 33A via rivets 6A5 that extend through rivet holes 6A3 in the first limiting stub 6A. The second limiting stub 6B is mounted movably in two adjacent second retention holes 33B via rivets 6B5 that extend through rivet holes 6B3 in the second limiting stub 6B such that after assembly the pointed free ends (6A1, 6B1), (6A2, 6B2) of the first and second limiting stubs 6A, 6B simultaneously contact two opposite ends of the stop block 62. Preferably, each of the first and second retention holes 33A, 33B is elongated and extends in a transverse direction relative to a longitudinal length of the interior plate 3 so as to permit limited movement of the rivets along the transverse direction during pivotal action of the limiting stubs 6A, 6B.

Figure 5:
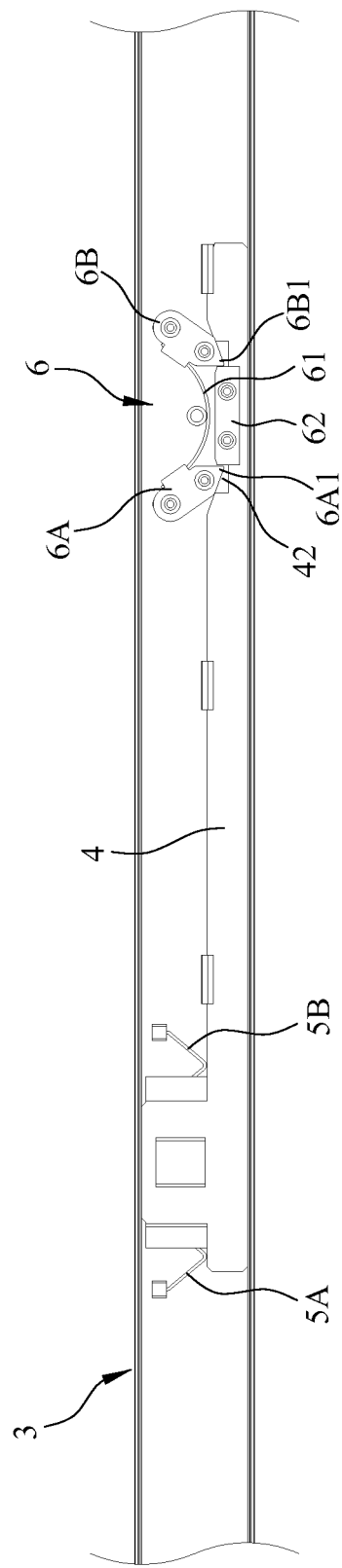
FIG. 5 illustrates the slide positioning device of the present invention for use in the sliding mechanism, where the interior plate is pulled outward from the intermediate plate in a locked condition.

A biasing element 61 is straddled around a stud 34 of the interior plate 3 for biasing the first and second limiting stubs 6A, 6B in such a manner that the pointed free ends (6A1, 6B1), (6A2, 6B2) of the limiting stubs 6A, 6B extend into the limit notch 42 so as be in contact with two opposite ends of the stop block 62, thereby preventing relative movement between the interior plate 3 and the intermediate plate 2 (see FIG. 5). In other words, when desired, the server can be pulled outward of the computer casing (pulling the interior plate 3 relative to the intermediate plate 2 till the pointed free ends contact the stop block).

In this embodiment, the biasing element 61 is generally a C-shaped leaf spring having two ends mounted into adjacent pair of the first and second retention holes 33A, 33B and a curved intermediate portion between two ends and straddling on the stud 34 for biasing against the sides 6A4, 6B4 of the first and second limiting stubs 6A, 6B such that the pointed free ends (6A1, 6B1), (6A2, 6B2) simultaneously contact the two opposite ends of the limit notch 42.

In case of replacing the server back into the computer casing or disassembling the server from the casing, the position limiting unit 6 can be manipulated in the following manner.

Figure 6:
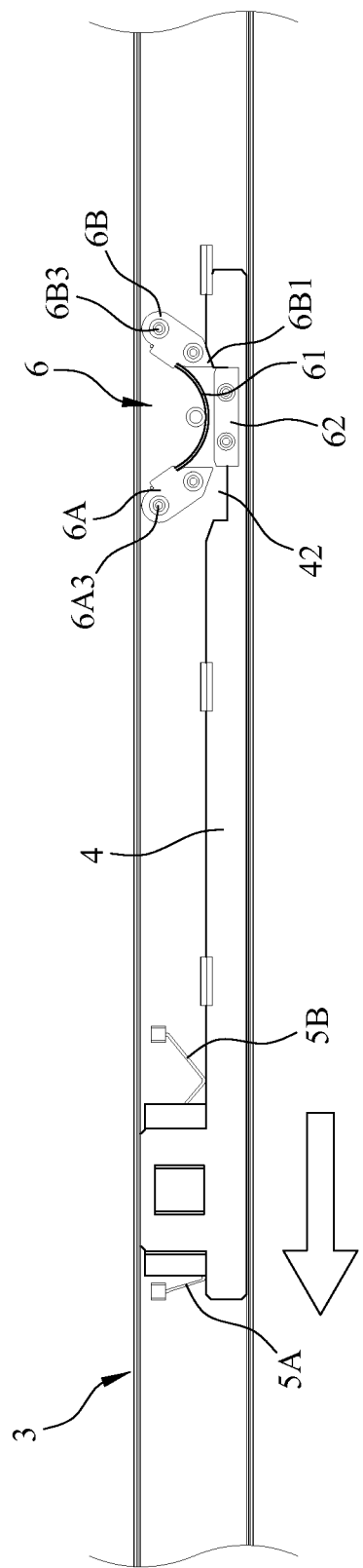
FIG. 6 illustrates the slide positioning device of the present invention for use in the sliding mechanism, in which a release rod is pulled outward so as to release two limiting stubs from a stop block of the intermediate plate.

Firstly, the user can pull the propeller portion 43 outward away from the interior plate 3 so as to slide the release rod 4 along the slide channel in the interior plate 3 in a first direction results in abutment of the end 422 of the notch 42 against the pointed free end 6B2 of the limiting stub 6B, thereby causing the pivotal action of the limiting stub 6B, which in turn, lifts the curved intermediate portion of the spring 61 upward so as to release the pointed free end (6A1, 6B1) of the limiting stub 6A from the notch 42 (see FIG. 6). Hence, the pointed free ends (6A1, 6B1), (6A2, 6B2) of the first and second limiting stubs 6A, 6B disengage from the limit notch 42, where the interior plate 3 can be removed from the intermediate plate 2 and vice versa.

Figure 7:
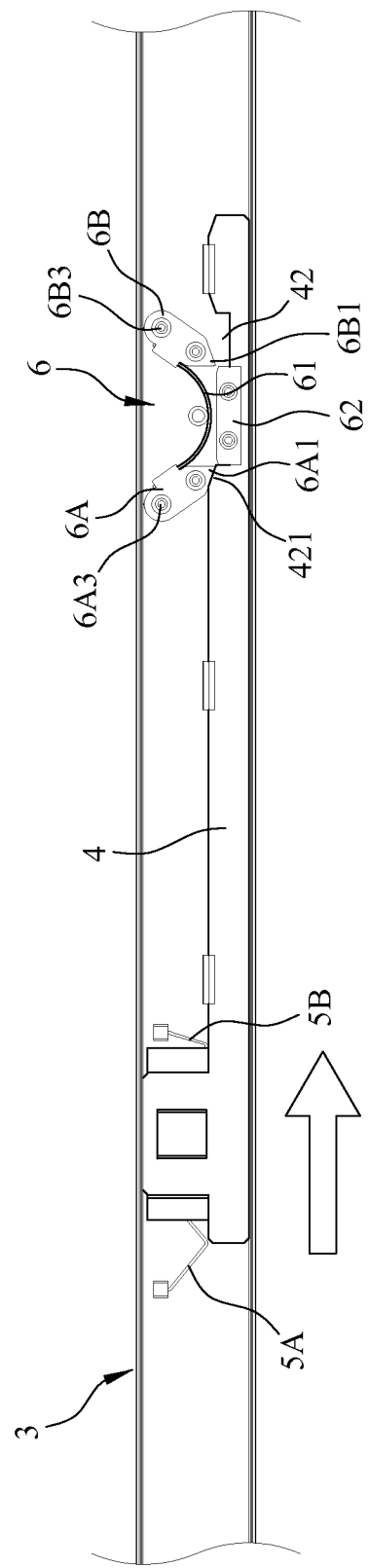
FIG. 7 illustrates the slide positioning device of the present invention for use in the sliding mechanism, in which the release rod is pushed inward relative to the intermediate plate so as to release the two limiting stubs from the stop block of the intermediate plate.

Secondly, the user can push the propeller portion 43 inward against the interior plate 3 so as to slide the release rod 4 along the slide channel in the interior plate 3 in a second direction opposite to the first direction results in abutment of the end 421 of the notch 42 against the pointed free end 6A1 of the limiting stub 6A, thereby causing the pivotal action of the limiting stub 6A, which in turn, lifts the curved intermediate portion of the spring 61 upward so as to release the pointed free end of the limiting stub 6B from the notch 42 (see FIG. 7). Hence, the pointed free ends (6A1, 6B1), (6A2, 6B2) of the first and second limiting stubs 6A, 6B disengage from the limit notch 42, where the interior plate 3 can be removed from the intermediate plate 2 and vice versa.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A slide positioning device for a sliding mechanism that includes an exterior plate, an intermediate plate connected slidably to the exterior plate and an interior plate connected slidably to the intermediate plate, each plate further defining inner and outer side surfaces, the slide positioning device is characterized by:

the intermediate plate having a stop block formed on the inner side surface thereof; and the interior plate including a position limiting unit, an elongated release rod that is mounted movably on the outer side surface and that has a propeller portion distal from the position limiting unit and a limit notch adjacent to said position limiting unit for receiving the stop block, and a resilient element engaging resiliently the propeller portion for restricting a longitudinal movement of the release rod with respect to the interior plate, the position limiting unit including first and second limiting stubs that are mounted movably on the outer side surface and that have pointed free ends, the interior plate further including a biasing element mounted between for biasing the first and second limiting stubs in such a manner that the pointed free ends extend into said limit notch so as be in contact with two opposite ends of said stop block, thereby preventing relative movement between the interior plate and the intermediate plate.

2. The slide positioning device according to claim 1, wherein the interior plate is formed with a plurality of first retention holes and a plurality of second retention holes, said first limiting stub being mounted movably in two adjacent said first retention holes via rivets, said second limiting stub being mounted movably in two adjacent said second retention holes via rivets such that the pointed free ends of the first and second limiting stubs simultaneously contact two opposite ends of said limit notch.

3. The slide positioning device according to claim 2, wherein said biasing element is a leaf spring having two ends mounted into adjacent pair of said first and second retention holes and a curved intermediate portion between two ends for biasing against the first and second limiting stubs such that the pointed free ends simultaneously contact the two opposite ends of said limit notch.

4. The slide positioning device according to claim 2, wherein each of said first and second retention holes is elongated and extends in a transverse direction relative to a longitudinal length of the interior plate.

5. The slide positioning device according to claim 1, wherein the interior plate has two embedded holes formed on the inner side surface, said propeller portion of said release rod having two engagement flaps located between said two embedded holes such that once said resilient element is mounted to said embedded holes said resilient element engaging resiliently said two engagement flaps for restricting the longitudinal movement of the release rod with respect to the interior plate.

6. The slide positioning device according to claim 5, wherein the resilient element is constituted by two V-shaped clips having vertexes overlapping said two engagement flaps of said release rod respectively to restrict the longitudinal movement of the release rod.

7. The slide positioning device according to claim 1, wherein the interior plate further a plurality of aligned rod guides fixed on the outer side surface for guiding the release rod to move along the longitudinal length thereof.

* * * * *